United States Patent
Pakala et al.

(10) Patent No.: US 9,564,582 B2
(45) Date of Patent: Feb. 7, 2017

(54) METHOD OF FORMING MAGNETIC TUNNELING JUNCTIONS

(71) Applicant: Applied Materials, Inc., Santa Clara, CA (US)

(72) Inventors: Mahendra Pakala, Fremont, CA (US); Mihaela Balseanu, Cupertino, CA (US); Jonathan Germain, San Francisco, CA (US); Jaesoo Ahn, Fremont, CA (US); Lin Xue, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 35 days.

(21) Appl. No.: 14/201,439

(22) Filed: Mar. 7, 2014

(65) Prior Publication Data
US 2015/0255507 A1 Sep. 10, 2015

(51) Int. Cl.
H01L 27/22 (2006.01)
H01L 43/12 (2006.01)
H01L 43/08 (2006.01)

(52) U.S. Cl.
CPC ............. H01L 43/12 (2013.01); H01L 43/08 (2013.01); H01L 27/222 (2013.01)

(58) Field of Classification Search
CPC ................................ H01L 27/228; H01L 43/02
USPC ........................................................ 257/211
See application file for complete search history.

(56) References Cited

U.S. PATENT DOCUMENTS

| | | | |
|---|---|---|---|
| 6,897,532 B1 | 5/2005 | Schwarz et al. | |
| 7,445,943 B2 | 11/2008 | Smith et al. | |
| 7,645,618 B2 * | 1/2010 | Ditizio | H01L 43/12 257/71 |
| 7,723,128 B2 * | 5/2010 | Wang | H01L 43/12 257/295 |
| 2009/0130779 A1 * | 5/2009 | Li | H01L 43/12 438/3 |
| 2013/0034917 A1 * | 2/2013 | Lee | H01L 43/12 438/3 |
| 2015/0035031 A1 * | 2/2015 | Kim | H01L 43/12 257/295 |

* cited by examiner

*Primary Examiner* — Kenneth Parker
*Assistant Examiner* — Warren H Kilpatrick
(74) *Attorney, Agent, or Firm* — Patterson & Sheridan, LLP

(57) ABSTRACT

A method for fabricating an MRAM bit that includes depositing a spacer layer that protects the tunneling barrier layer during processing is disclosed. The deposited spacer layer prevents byproducts formed in later processing from redepositing on the tunneling barrier layer. Such redeposition may lead to product failure and decreased manufacturing yield. The method further includes non-corrosive processing conditions that prevent damage to the layers of MRAM bits. The non-corrosive processing conditions may include etching without using a halogen-based plasma. Embodiments disclosed herein use an etch-deposition-etch sequence that simplifies processing.

20 Claims, 1 Drawing Sheet

METHOD OF FORMING MAGNETIC TUNNELING JUNCTIONS

BACKGROUND

Field

Aspects of the present disclosure relate generally to the fabrication of memory devices, and more specifically to methods of forming components of magnetoresistive random access memory devices.

Description of the Related Art

Random access memory (RAM) is the most common type of memory found in computing devices. Advances in RAM technology have allowed for an increase in computing power. One advance in RAM technology is the development of magnetoresistive random access memory (MRAM). Unlike other RAM technologies, data in MRAM is not stored as electric charge, but rather by magnetic storage elements, known as MRAM bits. MRAM bits have magnetic tunneling junction (MTJ) structures. MTJ structures are formed from two ferromagnetic layers separated by a thin dielectric layer. The thin dielectric layer is commonly referred to as a tunneling barrier layer. The tunneling barrier layer is designed to be thin enough to allow electrons from one ferromagnetic layer to "tunnel" through the tunneling barrier layer to the other ferromagnetic layer. One of the ferromagnetic layers, referred to as the "pinned" ferromagnetic layer, is set to a specific polarity. The polarity of the other ferromagnetic layer, referred to as the "free" ferromagnetic layer, can be changed by an electrical current. In spin transfer torque (STT) MRAM devices, the orientation of the free ferromagnetic layer can be modified by using a spin-polarized current, which is called writing.

To write a "0," or a low resistance state, on a bit which was previously a "1," or a high resistance state, a current is caused to pass from the free layer to the pinned layer. The electrons flowing through the pinned layer attain the majority spin along the pinned layer magnetization and exert a spin torque on the free layer to switch the magnetization direction to align along the pinned layer. To switch to the "1" state, a write current is caused to flow from the pinned layer to the free layer. The electrons flowing from the free layer with majority spin (aligned with pinned layer) pass through the pinned layer, but the electrons with minority spin are reflected back to the free layer. The minority spin electrons then exert spin torque on the moment of the free layer and switch the free layer to align along the minority spin, or anti-parallel, to the pinned layer. A bit state is read by sensing the resistance of the bit and comparing the resistance to a reference resistance, which is usually an average of the high and low resistance values.

MRAM offers the advantages over other types of non-volatile RAM (NVRAM) of being much faster while consuming less power and suffering from less degradation over time. However, current manufacturing yields of MRAM devices are low, while the industry demands that the size of MRAM devices decreases. For example, one obstacle for high manufacturing yields is that some etching processes in the fabrication of MRAM bits corrode the MTJ layers.

Accordingly, what is needed in the art is a new process flow for reliably fabricating MRAM devices.

SUMMARY

Embodiments disclosed herein include a method for fabricating an MRAM bit. The method includes introducing into a processing chamber a stack of layers. The stack includes: a conductive hardmask layer; a top electrode layer positioned below the conductive hardmask layer; a tunneling barrier layer adjacent to the top electrode layer; a bottom electrode layer adjacent to the tunneling barrier layer; and a substrate. Both the top and bottom electrode layers include a ferromagnetic layer. The tunneling barrier layer includes a dielectric material. Once the stack is introduced into the processing chamber, the top electrode layer and the tunneling barrier layer are etched, thereby exposing the sidewalls of the top electrode layer and the tunneling barrier layer. The method further includes depositing a spacer layer over the conductive hardmask layer, the sidewalls of the top electrode layer, the sidewalls of the tunneling barrier layer, and at least some of the bottom electrode layer. The deposition results in a sub-stack that includes the portions of the bottom electrode layer and the portions of the spacer layer that are adjacent to each other. Thereafter, at least some of the sub-stack is etched down to the substrate.

Other embodiments disclosed herein include a stack of layers. The stack includes: a substrate; a bottom electrode layer, which includes a ferromagnetic material and which is positioned above the substrate; a tunneling barrier layer, which includes a dielectric material and which is adjacent to the bottom electrode layer; a top electrode layer, which includes a ferromagnetic material and which is adjacent to the tunneling barrier layer; a conductive hardmask layer, which is above the top electrode; and a spacer layer. The bottom electrode layer, the tunneling barrier layer, the top electrode layer, and the hardmask layer have sidewalls; and the spacer layer covers the sidewalls of the tunneling barrier layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Disclosed embodiments include methods for fabricating an MRAM bit. The methods include introducing into a processing chamber a substrate having a stack of layers formed thereon. Layers contained in the stack include a conductive hardmask layer, a top electrode layer, a tunneling barrier layer, a bottom electrode layer, and a substrate. The methods include etching the top electrode layer and the tunneling barrier layer using an etching process that is devoid of a halogen-based plasma. Representative suitable etching processes include a reactive ion etching process that does not use a halogen-based plasma and an ion beam etching process. The disclosed etching process, devoid of a halogen-based plasma, also successfully etches through MTJ layers which are difficult to etch using conventional etching processes without causing corrosion. The methods disclosed herein also include depositing a spacer layer after the first etch over the conductive hardmask layer, the sidewalls of the top electrode layer, the sidewalls of the tunneling barrier layer, and at least some of the bottom electrode layer. The deposited spacer layer covers the tunneling barrier layer, thereby preventing byproducts formed in later processing from redepositing on the tunneling barrier layer. Such redeposition may lead to product failure and decreased manufacturing yield. The methods further include etching a sub-stack comprised of the bottom electrode layer and the spacer layer using an etching process that is also devoid of a halogen-based plasma. Embodiments using the etch-deposition-etch sequence benefit from simplified processing. For example, the sequence allows for the use of only a single self-aligned mask, which can increase process yields.

FIGS. 1A-1D are cross-sectional views of an MRAM bit at different stages of a process disclosed herein. The process begins by introducing into an etching chamber, such as into an etching chamber of a vacuum processing system, a stack of layers 100 formed on a substrate 110. A vacuum processing system includes a tool within which a substrate may be processed in two or more vacuum processing chambers without breaking vacuum, i.e., without exposing the substrate to an ambient environment. A representative vacuum processing system is a cluster tool, such as a CENTURA™ or ENDURA™ cluster tool available from Applied Materials, Inc. of Santa Clara, Calif., or other suitable cluster tool. The stack of layers 100 formed on a substrate 110 may be positioned on a substrate support within a vacuum processing chamber. The substrate support may be configured to heat the stack of layers 100 and the substrate 110.

Figure 1A:
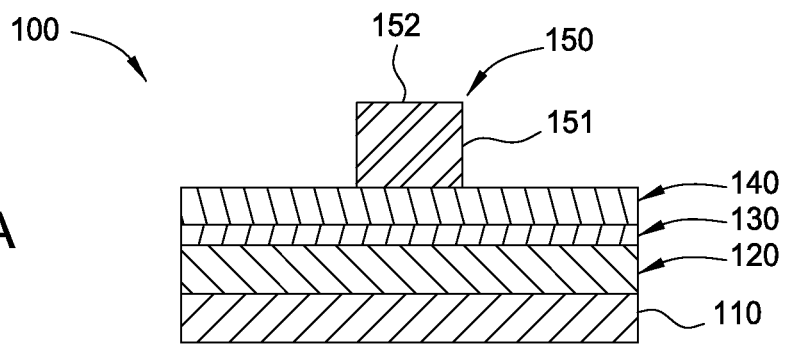
FIGS. 1A-1D illustrate a magnetic random access memory bit at different stages of an embodiment of a process disclosed herein.

In FIG. 1A, the stack 100 includes a conductive hardmask layer 150 (shown here after etching the hard mask layer 150), a top electrode layer 140, a tunneling barrier layer 130, a bottom electrode layer 120, and a substrate 110. In some embodiments, layers may be positioned above the conductive hardmask layer 150. The conductive hardmask layer 150 has sidewalls 151 and a top surface 152. The top surface 152 may be substantially flat. As shown, the conductive hardmask layer 150 includes only a single feature; however, it is to be understood that the stack 100 may comprise a plurality of conductive hardmask features. The sidewalls 151 of the conductive hardmask layer 150 may be vertical (as shown) or sloped. In embodiments where the sidewalls 151 are sloped, the angle formed by the sidewalls 151 and the top surface may be from about just greater than 90° to about 120°, such as from about just greater than 90° to about 100°, such as about 95°. The conductive hardmask layer 150 may have a thickness from about 250 Å to about 2500 Å, such as from about 500 Å to about 1500 Å, such as about 1000 Å. The conductive hardmask layer 150 may be comprised of a conductive material, such as, for example, tantalum, tungsten, an alloy of tungsten and tantalum, TiN, or other suitable material. The conductive hardmask layer 150 may serve as a lead in an MRAM bit.

The features of the conductive hardmask layer 150 may be formed by pattern transfer from a photomask. A photoresist may be applied on top of a blanket hardmask layer 150. Thereafter, the photoresist layer may be exposed and developed. The development phase may use, for example, reactive ion etching.

The top electrode layer 140 may be positioned below the conductive hardmask layer 150. The top electrode layer 140 may be substantially flat. The top electrode layer 140 may have a thickness that ranges from about 50 Å to about 200 Å, such as from about 50 Å to about 75 Å, such as about 55 Å. The top electrode layer 140 may include multiple layers, or the top electrode layer may include a single layer. At least one layer of the top electrode layer 140 includes a ferromagnetic material, such as, for example, an alloy of cobalt, an alloy of nickel, an alloy of iron, an alloy of palladium, an alloy of platinum, an alloy of tantalum, mixtures thereof, or other suitable material. For example, the ferromagnetic material may be an alloy of cobalt, iron and platinum; an alloy of cobalt, iron and boron; an alloy of cobalt, nickel, iron, palladium and platinum; or an alloy of cobalt, iron, tantalum, nickel, and boron. Other layers that may be included in the top electrode layer 140 include, for example, a storage layer, a spin polarization enhancing layer, a reference layer, and/or an anti-ferromagnetic (AFM) layer. The top electrode layer 140 may be either pinned or free.

The tunneling barrier layer 130 may be positioned below the top electrode layer 140. For example, the tunneling barrier layer 130 may be adjacent to the top electrode layer 140. The tunneling barrier layer 130 may be substantially flat. The tunneling barrier layer 130 may have a thickness that ranges from about 7 Å to about 30 Å, such as from about 10 Å to about 20 Å, for example, about 10 Å. The tunneling barrier layer includes a dielectric material. The tunneling barrier layer 130 may include, for example, magnesium oxide, titanium oxide, aluminum oxide, zinc oxide, mixtures thereof, or other suitable materials.

The bottom electrode layer 120 may be positioned below the tunneling barrier layer 130. For example, the bottom electrode layer 120 may be adjacent to the tunneling barrier layer 130. The bottom electrode layer 120 may be substantially flat. The bottom electrode layer 120 may have a thickness that ranges from about 50 Å to about 300 Å, such as about 75 Å. The bottom electrode layer 120 may include a multitude of layers, or it may include a single layer. At least one layer of the bottom electrode layer 120 includes a ferromagnetic material, such as, for example, an alloy of cobalt, an alloy of iron, an alloy of platinum, an alloy of nickel, an alloy of palladium, mixtures thereof, or other suitable material. For example, the ferromagnetic material may be an alloy of cobalt, iron and platinum; an alloy of cobalt, iron and boron; an alloy of cobalt, nickel, iron, palladium and platinum; or an alloy of cobalt, iron, tantalum, nickel, and boron. Other layers that may be included in the bottom electrode layer 120 include a storage layer, a spin polarization enhancing layer, a reference layer, and/or an AFM layer. The bottom electrode layer 120 may be either pinned or free.

The substrate 110 may be positioned below the bottom electrode layer 120. For example, the substrate may be positioned directly below the bottom electrode layer 120. Alternatively, intervening layers may be present between the substrate 110 and the bottom electrode layer 120. The substrate 110 may be made of, for example, a conductor or an insulator. In other embodiments, the substrate 110 has portions made of a conductor, such as the central portion, and portions made of an insulator, such as the edge portions. The substrate 110 may be substantially flat. In embodiments wherein the substrate 110 is a conductor, the substrate 110 may include a metal, such as tantalum, tantalum nitride, titanium nitride, ruthenium, an alloy of tantalum and ruthenium, or other suitable material. In embodiments wherein the substrate 110 is a conductor, the substrate 110 may function as a lead. In embodiments wherein the substrate 110 is an insulator, the substrate 110 may include a dielectric material, such as, for example, silicon dioxide, aluminum oxide, mixtures thereof, or other suitable materials. In embodiments wherein the substrate 110 has a central portion that is made of a conductor and edge portions that are made of an insulator, the central conducting portion may be electrically connected to the bottom electrode 120.

After the stack of layers 100 formed on the substrate 110 is introduced into the etching chamber, the top electrode layer 140 and the tunneling barrier layer 130 may be etched in a first etching process using the conductive hardmask layer 150 as a mask. The first etching process is configured to form vertical or near vertical sidewalls of the etched layers. The etching process may be, for example, an etching process that does not use a halogen-based plasma. Suitable etching processes include a reactive ion etching (RIE) process that does not use a halogen-based plasma. The plasma of the RIE process may be generated, for example, using an inductively coupled plasma (ICP) source. The RIE process may use, for example, one or more of argon, $N_2$, $H_2$, CO, $NH_3$, He, $CH_3OH$, and $C_2H_5OH$ as etching species. Alternatively, the etching process may be an ion beam etching (IBE) process (also known as ion milling or sputter etching). The IBE process may use any of the gases or mixtures that are suitable for the RIE process as etching species.

In embodiments wherein a RIE process is used with an ICP source to etch without a halogen-based plasma, the following conditions may be used. The temperature of the substrate support may be from about 20° C. to about 300° C., such as from about 40° C. to about 80° C. The pressure of the vacuum processing chamber may from about 1 mTorr to about 100 mTorr, such as from about 20 mTorr to about 40 mTorr. Argon, nitrogen, and hydrogen may be introduced into the vacuum processing chamber. The flow rate of argon may be from about 20 sccm to about 100 sccm, such as from about 40 sccm to about 60 sccm. The flow rate of nitrogen may be from about 20 sccm to about 100 sccm, such as from about 40 sccm to about 60 sccm. The flow rate of hydrogen may be from about 20 sccm to about 100 sccm, such as from about 40 sccm to about 60 sccm. The power to the coil may be from about 100 W to about 2000 W, such as from about 200 W to about 1000 W. The bias power may be from about 0 W to about 1000 W, such as from about 20 W to about 700 W. The endpoint may be determined by a timed etch and/or with an optical endpoint detector. Suitable etch reactors include, for example, the Centris Advantege Mesa Etch™ and the Centura Advantege Mesa Etch™ available from Applied Materials, Inc. of Santa Clara, Calif., or other suitable etch reactors tool.

Figure 1B:
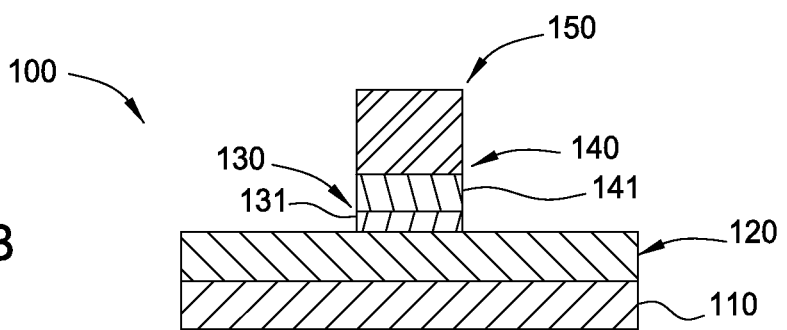

One embodiment of the resulting etched stack of layers 100 on the substrate 110 is shown in FIG. 1B. The first etching process forms vertical sidewalls of the top electrode layer 140 and the tunneling barrier layer 130. After the etching process, the top electrode layer 140 may have sidewalls 141 and the tunneling barrier layer 130 may have sidewalls 131. The sidewalls 131, 141, and 151 have a vertical profile.

After the top electrode layer 140 and the tunneling barrier layer 130 are etched, a blanket spacer layer 160 is deposited over the substrate 110 and the etched stack of layers 100 thereon. In one embodiment, the spacer layer may be deposited over the conductive hardmask top surface 152 and sidewalls 151, the top electrode layer sidewalls 141, the tunneling barrier layer sidewalls 131, and at least some of the bottom electrode layer 120, such as the exposed part of the bottom electrode 120. In some embodiments, the deposition may occur without breaking vacuum after the etching of the top electrode layer 140 and the tunneling barrier layer 130. In some embodiments, the spacer layer 160 may be deposited conformally (as shown in FIG. 1C).

The spacer layer 160 may have a thickness of about 25 Å to about 200 Å, such as from about 40 Å to about 150 Å, such as about 80 Å. The spacer layer 160 has a low etch rate to the physical bombardment of ions in an etching process, such as in a reactive ion etching process or an ion beam etching process that uses predominately physical etching. The physical etch rate should be less than the physical etch rate of ferromagnetic materials used in the bottom electrode layer 120 and the top electrode layer 140. The spacer layer 160 may include SiCN, MgO, SiO, SiN, aluminum oxide, mixtures thereof, or other suitable materials.

The spacer layer 160 may be deposited, for example, using chemical vapor deposition (CVD), plasma enhanced chemical vapor deposition (PECVD), physical vapor deposition (PVD), or other suitable techniques. The spacer layer 160 may be deposited at a temperature of less than about 400° C., such as less than about 250° C. Temperatures lower than about 400° C. may prevent damage to the spacer layer 160, such as a spacer layer 160 made of MgO. The spacer layer 160 may be deposited using a method that includes a plasma densification process. The inclusion of a plasma densification process may improve the wet etching ratio (100:1 dilute hydrofluoric acid) of the spacer layer 160 compared to a typical silicon thermal oxide layer. In a representative example, the wet etching rate of the spacer layer 160 is 0.1 times the wet etching rate of the thermal oxide.

Figure 1C:
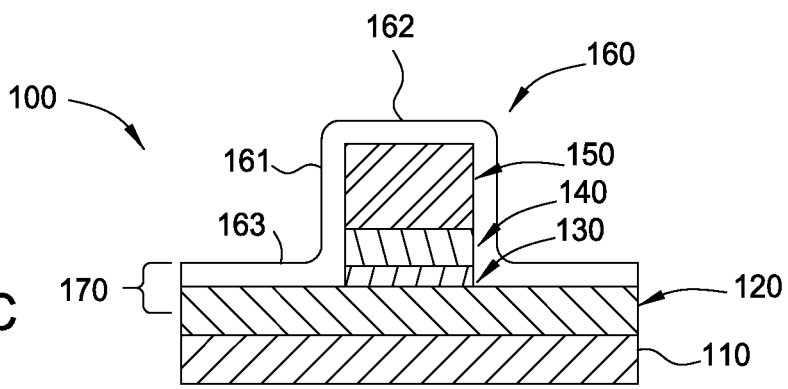

In the embodiment shown in FIG. 1C, the spacer layer 160 is blanket deposited over the stack of layers 100. The spacer layer 160 has a top surface 162 over the conductive hardmask top surface 151, a side surface 161 over the conductive hardmask layer sidewalls 151, the top electrode layer sidewalls 141, and the tunnel barrier layer sidewalls 131. The spacer layer 160 also has a lower surface 163 over some of the bottom electrode layer 120. A sub-stack 170 comprises the portions of spacer layer lower surface 163 and the portions of the bottom electrode 120 that are adjacent to each other.

After the spacer layer 160 is deposited, the stack of layers 100 and the substrate may be transferred to an etching chamber for a second etching process. The second etching process is configured to form vertical or near vertical sidewalls of the bottom electrode layer 130. In one embodiment, the stack of layers 100 may be transferred to an etching chamber without breaking vacuum. The second etching process may be a directional etching process wherein the etching takes place in a direction substantially perpendicular to the substrate 110. The second etching process etches at least some of the sub-stack 170 down to the substrate 110. The second etching process leaves the tunneling barrier layer sidewalls 131 covered by the spacer layer side surface 161. The second etching process may also leave the top electrode layer sidewalls 141 and the conductive hardmask layer sidewalls 151 covered by the spacer layer side surface 161. The bottom electrode layer 120 is defined by sidewalls 121. The second etching process may be, for example, an etching process that does not use a halogen-based plasma. For example, the second etching process may be an RIE process. The RIE process may use, for example, one or more of the gases suitable for RIE processing in the first etching process as etching species. For example, the RIE process may use argon and $N_2/H_2$. The plasma may be generated, for example, using an ICP source. In another embodiment, the etching process may be an IBE process. The IBE process may use any of the gases or mixtures that are suitable for the RIE process as etching species. In yet another embodiment, the etching process may use a fluorine-based chemistry.

In embodiments wherein a RIE process is used with an ICP source to etch without a halogen-based plasma, the following conditions may be used. The temperature of the substrate support may be from about 20° C. to about 300° C., such as from about 40° C. to about 150° C. The pressure of the vacuum processing chamber may from about 1 mTorr to about 100 mTorr, such as from about 20 mTorr to about 40 mTorr. Argon, nitrogen, and hydrogen may be introduced into the vacuum processing chamber. The flow rate of argon may be from about 20 sccm to about 100 sccm, such as from about 40 sccm to about 60 sccm. The flow rate of nitrogen may be from about 20 sccm to about 100 sccm, such as from about 40 sccm to about 60 sccm. The flow rate of hydrogen may be from about 20 sccm to about 100 sccm, such as from about 40 sccm to about 60 sccm. The power to the coil may be from about 100 W to about 1500 W, such as from about 200 W to about 1000 W. The bias power may be from about 0 W to about 1000 W, such as from about 20 W to about 700 W. The endpoint may be determined by a timed etch and/or with an optical endpoint detector.

Figure 1D:
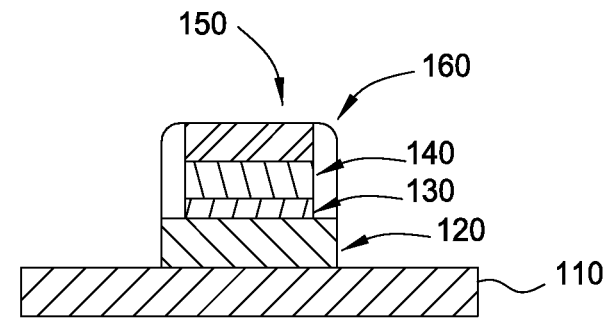

In the embodiment shown in FIG. 1D, the second etching process is configured to form vertical sidewalls of the bottom electrode layer 130. The sub-stack 170 is etched down to the substrate 110. The conductive hardmask layer 150 has been partially etched in the directional etching process such that the top surface 152 is closer to the substrate 110 after etching than before. The vertical profile of the first etching process remains after the second etching process. The embodiment shown in FIG. 1D may be used as an MRAM bit.

The previously described embodiments have many advantages, including the following. The etching process does not use a halogen-based plasma, and therefore is unlikely to corrode the MTJ layers of the MRAM bit. The disclosed etching process, devoid of a halogen-based plasma, also successfully etches through MTJ layers which are difficult to etch using conventional etching processes. The spacer layer 160 prevents byproducts formed in later processing from redepositing on the tunneling barrier layer. Such redeposition may lead to product failure. Moreover, embodiments using the etch-deposition-etch sequence benefit from simplified processing.

Using SiCN, aluminum oxide, MgO, as the spacer layer 160 has allowed for a successful second etch without destroying the vertical or near vertical profile obtained by the first etch. Although not to be limited by theory, it is believed that the maintained vertical or near vertical profile is made possible by the low physical etching rate of the spacer layer 160. Furthermore, the MRAM bits fabricated according to the methods disclosed herein demonstrate high performance. On a within wafer study, embodiments having a bit width of 120 nm demonstrate a tunneling magnetoresistance (TMR) ranging from about 70% to about 101% and a $R_{min}$ ranging from about 700 ohms to about 1000 ohms. On another within wafer study, embodiments having a bit width of 80 nm demonstrate a tunneling magnetoresistance (TMR) ranging from about 77% to about 102% and a $R_{min}$ ranging from about 1500 ohms to about 2000 ohms. On another within wafer study, embodiments having a bit width of 60 nm demonstrate a TMR ranging from about 50% to about 100% and a $R_{min}$ ranging from about 2500 ohms to about 4500 ohms. In a current switching experiment using embodiments having a 60 nm bit width, the $R_{min}$ was approximately 3500 ohms, the $R_{max}$ was approximately 6700 ohms, a sharp forward switching occurred at approximately 1150 A/m, and a sharp reverse switching occurred at approximately 850 A/m. Additionally, a switching current density of 2.9 MA/cm$^2$ was obtained. The aforementioned advantages are illustrative and not limiting. It is not necessary for all embodiments of the invention to have all the advantages of the invention or fulfill all the purposes of the invention.

While the foregoing is directed to embodiments of the present invention, other and further embodiments of the invention may be devised without departing from the basic scope thereof, and the scope thereof is determined by the claims that follow.

The invention claimed is:

1. A method for fabricating a magnetic random access memory bit, the method comprising:
   introducing into a processing chamber a stack, wherein the stack comprises:
      a conductive hardmask layer;
      a top electrode layer comprising a ferromagnetic layer, wherein the top electrode layer is positioned below the conductive hardmask layer;
      a tunneling barrier layer, wherein the tunneling barrier layer is comprised of a dielectric material, and wherein the tunneling barrier layer is adjacent to the top electrode layer;
      a bottom electrode layer comprising a ferromagnetic layer, and wherein the bottom electrode layer is adjacent to the tunneling barrier layer; and
      a substrate, wherein the substrate is positioned below the bottom electrode layer;
   etching the top electrode layer and the tunneling barrier layer, thereby exposing the sidewalls of the tunneling barrier layer;
   depositing a spacer layer over the sidewalls of the tunneling barrier layer and at least some of the bottom electrode layer, thereby forming a sub-stack comprising the portions of the bottom electrode layer and the portions of the spacer layer that are adjacent to each other;
   plasma densifying the spacer layer formed on the substrate; and
   etching the stack using a gas mixture including $N_2$ and $H_2$, wherein the etching process:
      etches at least some of the sub-stack down to the substrate; and
      leaves the sidewalls of the tunneling barrier layer covered by the spacer layer.

2. The method of claim 1, wherein the etching of the top electrode layer and the tunneling barrier layer does not use a halogen-based plasma formed from the gas mixture including $N_2$ and $H_2$.

3. The method of claim 2, wherein at least one of the etching of the top electrode layer and the tunneling barrier layer and the etching of the stack comprises using a reactive ion etching process or an ion bombardment etching process.

4. The method of claim 3, wherein the reactive ion etching process and the ion bombardment etching process comprises etching using at least one of argon, $N_2$, $H_2$, CO, $NH_3$, He, $CH_3OH$, and $C_2H_5OH$.

5. The method of claim 4, wherein the reactive ion etching process and the ion bombardment etching process comprises etching using argon, $N_2$, and $H_2$.

6. The method of claim 3, wherein etching the top electrode layer and the tunneling barrier layer, depositing a spacer layer, and etching the stack are performed without breaking vacuum.

7. The method of claim 2, wherein the etch rate to physical bombardment of ions of the spacer layer is lower than the etch rate to physical bombardment of ions of the ferromagnetic layer of the top electrode layer and of the ferromagnetic layer of the bottom electrode layer.

8. The method of claim 1, wherein the etch rate to physical bombardment of ions of the spacer layer is lower than the etch rate to physical bombardment of ions of the ferromagnetic layer of the top electrode layer and of the ferromagnetic layer of the bottom electrode layer.

9. The method of claim 1, wherein the spacer layer comprises a material selected from a group consisting of SiCN, MgO, SiO, SiN, aluminum oxide, and mixtures thereof.

10. The method of claim 9, wherein the spacer layer has a thickness of between about 25 Å and about 200 Å.

11. The method of claim 1, wherein the spacer layer comprises a material selected from a group consisting of SiCN, MgO, SiO, SiN, aluminum oxide, and mixtures thereof.

12. The method of claim 11, wherein the tunneling barrier layer comprises a dielectric material selected from the group consisting of magnesium oxide, titanium oxide, aluminum oxide, and mixtures thereof.

13. The method of claim 12, wherein:
at least one of the ferromagnetic layer of the top electrode layer and the ferromagnetic layer of the bottom electrode layer comprises an alloy of cobalt, an alloy of iron, an alloy of platinum, an alloy of nickel, an alloy of palladium, or mixtures thereof; and
the conductive hardmask layer comprises tantalum.

14. The method of claim 13, wherein the top electrode layer has a thickness of between about 50 Å and about 200 Å;
the tunneling barrier layer has a thickness of between about 7 Å and about 30 Å;
the bottom electrode layer has a thickness of between about 50 Å and about 300 Å; and
the spacer layer has a thickness of between about 25 Å and about 200 Å.

15. A method for fabricating a magnetic tunneling junction bit, the method comprising:
introducing into a processing chamber a stack, wherein the stack comprises:
a conductive hardmask layer, wherein the conductive hardmask layer comprises tantalum;
a top electrode layer comprising a ferromagnetic layer, wherein the top electrode layer is positioned below the conductive hardmask layer, wherein the top electrode layer is comprised of an alloy of cobalt, iron, and platinum, and wherein the top electrode has a thickness of between about 50 Å and about 200 Å;
a tunneling barrier layer, wherein the tunneling barrier layer is adjacent to the top electrode layer, wherein the tunneling layer is comprised of MgO, and wherein the tunneling barrier layer has a thickness of between about 7 Å and about 20 Å;
a bottom electrode layer, wherein the bottom electrode layer comprises an alloy of cobalt, iron, and platinum, wherein the bottom electrode layer has a thickness of between about 50 Å and about 300 Å, and wherein the bottom electrode layer is adjacent to the tunneling barrier layer; and
a substrate;
etching the top electrode layer and the tunneling barrier layer, thereby exposing the sidewalls of the tunneling barrier layer, and wherein the etching of the top electrode layer and the tunneling layer comprises an ion beam etching process or a reactive ion etching process that does not include a halogen-based plasma;
depositing a spacer layer over the sidewalls of the tunneling barrier layer and at least some of the bottom electrode layer, thereby forming a sub-stack comprising the portions of the bottom electrode layer and the portions of the spacer layer that are adjacent to each other, and wherein the thickness of the spacer layer is between about 25 Å and about 200 Å;
plasma densifying the spacer layer formed on the substrate;
etching the stack, wherein the etching process:
etches at least some of the sub-stack down by a gas mixture including $N_2$ and $H_2$ to the substrate;
leaves the sidewalls of the tunneling barrier layer covered by the spacer layer; and
comprises an ion beam etching process or a reactive ion etching process that does not include a halogen-based plasma; and
wherein etching the top electrode layer and the tunneling barrier layer, depositing the spacer layer, and etching the stack are performed without breaking vacuum.

16. The method of claim 15, wherein at least one of the etching of the top electrode layer and the tunneling barrier layer and the etching of the stack comprises a reactive ion etching process using argon, nitrogen, and hydrogen.

17. A stack comprising:
a substrate;
a bottom electrode layer comprising a ferromagnetic material, wherein the bottom electrode layer is above the substrate, and wherein the bottom electrode layer has sidewalls;
a tunneling barrier layer above and adjacent to the bottom electrode, wherein the tunneling barrier layer has sidewalls;
a top electrode layer comprised of a ferromagnetic material, wherein the top electrode layer is positioned above the tunneling barrier layer, wherein the top electrode layer is adjacent to the tunneling barrier layer and wherein the top electrode layer has sidewalls;
a conductive hardmask layer positioned above the top electrode; and
a plasma densified spacer layer covering the sidewalls of the tunneling barrier layer, wherein the plasma densified spacer layer has a top surface substantially coplanar with the conductive hardmask layer.

18. The stack of claim 17, wherein the spacer layer comprises a material selected from a group consisting of SiCN, MgO, SiO, SiN, aluminum oxide, and mixtures thereof.

19. The stack of claim 18, wherein the tunneling barrier layer is comprised of a dielectric material selected from the group consisting of magnesium oxide, titanium oxide, or aluminum oxide, and mixtures thereof; and wherein the top electrode layer has a thickness of from between about 50 Å and about 200 Å; and wherein the bottom electrode layer has a thickness of from about 50 Å to about 300 Å.

20. The stack of claim 18, wherein the plasma densified spacer layer has sidewalls aligned with sidewalls of the bottom electrode layer.

* * * * *

UNITED STATES PATENT AND TRADEMARK OFFICE
CERTIFICATE OF CORRECTION

PATENT NO.       : 9,564,582 B2
APPLICATION NO.  : 14/201439
DATED            : February 7, 2017
INVENTOR(S)      : Pakala et al.

Page 1 of 1

It is certified that error appears in the above-identified patent and that said Letters Patent is hereby corrected as shown below:

In the Specification

Column 5, Line 45, delete "Advantege" and insert -- Advantedge --, therefor.
Column 5, Line 46, delete "Advantege" and insert -- Advantedge --, therefor.

Signed and Sealed this
Fourth Day of July, 2017

Joseph Matal
*Performing the Functions and Duties of the
Under Secretary of Commerce for Intellectual Property and
Director of the United States Patent and Trademark Office*